United States Patent [19]

Nishiwaki et al.

[11] Patent Number: 5,186,872
[45] Date of Patent: Feb. 16, 1993

[54] METHOD FOR GENERATION AND COLLECTION OF ULTRA FINE PARTICLES WITHOUT SCATTER

[75] Inventors: Akira Nishiwaki; Yasuo Morohoshi, both of Hino, Japan

[73] Assignee: Konica Corporation, Tokyo, Japan

[21] Appl. No.: 722,973

[22] Filed: Jun. 28, 1991

[30] Foreign Application Priority Data

Jun. 29, 1990 [JP] Japan ................... 2-172125
Aug. 23, 1990 [JP] Japan ................... 2-222118

[51] Int. Cl.$^5$ ............................. B29B 9/00
[52] U.S. Cl. ...................... 264/5; 427/180; 427/368; 118/50; 118/112; 118/726
[58] Field of Search ............. 427/180, 368; 118/50, 118/112, 726; 392/386, 387, 389, 394; 264/81, 5

[56] References Cited

U.S. PATENT DOCUMENTS

| | | | |
|---|---|---|---|
| 4,395,440 | 7/1983 | Abe et al. | 427/180 |
| 4,551,303 | 11/1985 | Moriguchi et al. | 427/76 |
| 4,654,229 | 3/1987 | Morita et al. | 427/180 |
| 4,913,865 | 4/1990 | Toyotama | 427/180 |

FOREIGN PATENT DOCUMENTS 62-128515  6/1987  Japan ................... 118/726

*Primary Examiner*—Shrive Beck
*Assistant Examiner*—Terry J. Owens
*Attorney, Agent, or Firm*—Jordan B. Bierman

[57] ABSTRACT

A method of producing fine particles of a material by evaporating the material into an inert gas. The material is evaporated in a evaporation vessel and the fine particles are generated by cooling the evaporated material with the inert gas blown into the evaporated material from the evaporation vessel. The flow of the fine particles is restricted within a path from the evaporation vessel toward a deposit holding body by means of a scatter preventing wall around the path. The fine particles are deposited on the surface of the evaporation vessel and then receovered.

6 Claims, 8 Drawing Sheets

METHOD FOR GENERATION AND COLLECTION OF ULTRA FINE PARTICLES WITHOUT SCATTER

BACKGROUND OF THE INVENTION

The present invention relates to a method and apparatus for generation and collection of ultra fine particles which are used in order to obtain organic photo-conductive ultra fine particles used in the production of an electrophotographic photoreceptor, and more particularly relates to a method and apparatus by which ultra fine particles are generated and recovered by the gaseous vaporization method.

An electrophotographic photoreceptor is basically composed of an electrically conductive base and a photosensitive layer provided thereon. Selenium is conventionally used for a photo-conductive material to form the photosensitive layer. Cadmium sulfide and zinc oxide are used as an inorganic photo-conductive material.

Recently, attempts have been made in order to improve film forming property by utilizing an organic photo-conductive material and to improve productivity by adopting a coating method. Organic photo-conductive materials are advantageous in that: color sensitivity can be freely controlled by selecting an appropriate sensitizer for a dye or a pigment to be used. The following compounds have been known as an organic photoconductive material: poly-N-vinylcarbazole, and 2,5-bis (P-diethyl aminophenyl)-1,3,4-oxadiazole.

On the other hand, ultra fine particles, the particle size of which is defined by $\mu m$ or Å, have been investigated recently. These ultra fine particles are characterized in that: they exhibit high activity as the specific surface area increases.

The following methods are generally used to obtain ultra fine particles or to adhere the ultra fine particles onto the surface of the base material: a gaseous phase generation method (such as an electric furnace method, a chemical flame method, a plasma method, or a gaseous vaporization method), a liquid phase method (such as a precipitation method or a solvent vaporization method), or a physical crushing method (such as a sand mill, or a ball mill).

In general, when a material is vaporized in a high vacuum state and deposited onto the surface of a base material, a vapor deposited film is formed, so that the vaporized material can not be recovered in the form of particles. However, in the case of the aforementioned gaseous vaporization method, it is possible to collect the vaporized material in the form of ultra fine particles, so that this method has been watched with keen interest. By the gaseous vaporization method, ultra fine particles are recovered in such a manner that: an inert gas is charged into a vacuum vessel, the pressure of which is maintained at $10^{-2}$ to $10^2$ Torr; in an atmosphere of the inert gas, various materials are heated so that they can be vaporized or sublimated; the obtained vaporized molecules collide with the inert gas molecules, then gradually cool and cohere with one another so that ultra ultra fine particle are formed; and the formed ultra ultra fine particle are recovered.

Conventionally, the aforementioned gaseous vaporization method has been mainly studied to obtain inorganic or metallic ultra fine particles. However, it has been studied in order to obtain organic ultra fine particles as described in "Functional Materials" page 44–49, vol. June 1987.

Figure 7A:
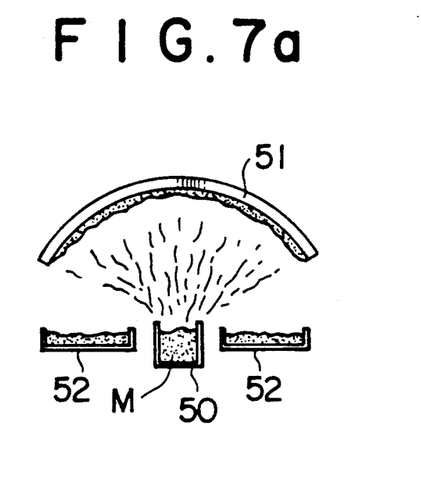
Figure 7B:
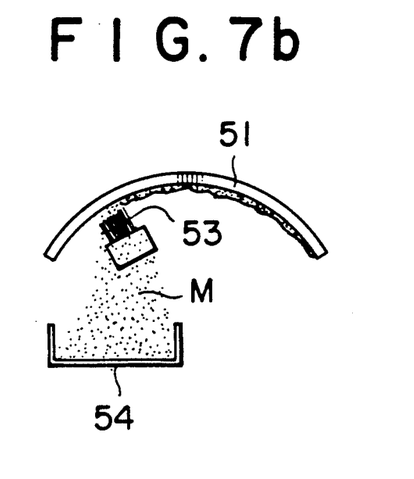

As illustrated in FIG. 7-a, the first method comprises the following processes: a vessel 50 in which vaporizable material M is held, a plane or curved plate 51 onto which the vaporized material is adhered, and a collection vessel into which the ultra fine particles are recovered, if necessary, are provided inside a vacuum chamber (not illustrated); an inert gas is charged into the vacuum chamber; a vessel 50 or vaporizable material M is heated so that material M can be vaporized; the vaporized material adheres onto the aforementioned curved plate 51; and after that, the material deposited on the curved plate 51 is scraped off by a brush 53 as illustrated in FIG. 7-b so that the ultra fine particles are recovered into a collection box 54.

Figure 8:
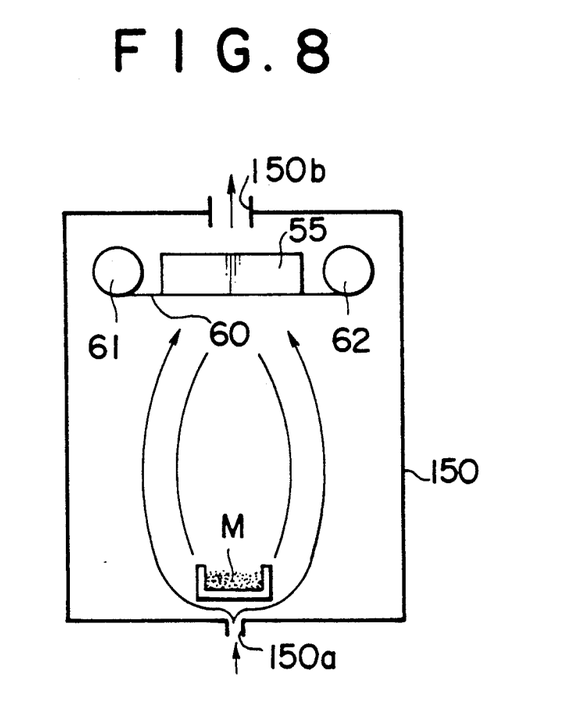
Figure 9A:
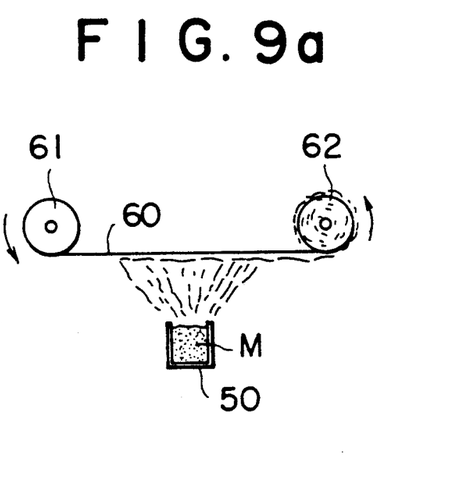
Figure 9B:
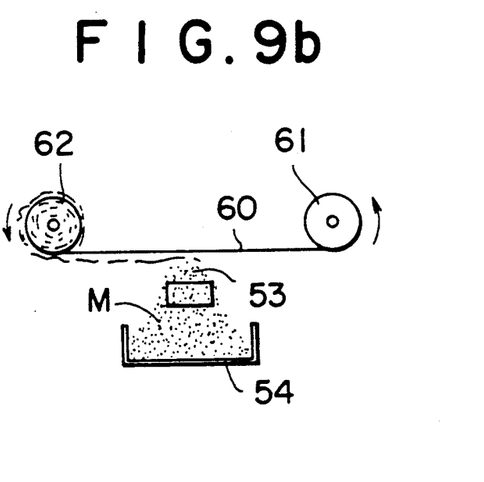

As illustrated in FIG. 8 and FIG. 9-a, the second method comprises the following processes: while a plastic web 60 onto which the material is deposited, is unreeled from a reel 61, the plastic web 60 is wound by a reel 62; while the aforementioned process is conducted, vaporizable material M is vapor-deposited onto the surface of the web 60 in the same manner as the first method; when the material is recovered, the web 60 is unreeled by the reel 62 as illustrated in FIG. 9-b; and in the process described above, material M deposited on the surface of the plastic web is scraped off by a brush or the like so that the material can be recovered into the collection box 54.

In the case of the conventional method described above, there is no scatter-preventing-wall, which restricts the movement of vaporizable material M, in the space between the vessel 50 for vaporizable material M and the curved plate 51 or the web 60.

However, in the case where vaporized material M is freely scattered and deposited in the conventional manner described above, some part of material M is scattered to the portion other than the surface of a body onto which material M must be deposited. The temperature of a vacuum chamber wall and that of the members disposed inside the wall, are lower than the temperature of the vaporizing source, so that the scattered material thermally deposits on the inner wall of the vacuum chamber or the surfaces of the members provided inside the chamber. The material deposited in the manner described above can not be recovered, so that the ratio of collection is not good. The ultra fine particles deposited on the inner wall of the vacuum chamber or the surfaces of the inner members, must be cleaned and removed before the production of the successive batch is started, which requires much labor. Accordingly, the productivity can not be improved.

It is a primary object of the present invention to prevent the collection ratio of ultra fine particles from deteriorating so that the collection ratio can be improved, and to reduce the labor required to clean the inner wall of the vacuum chamber.

From the viewpoint of electrophotographic characteristics, it is desirable that the grain size of a photosensitive material is reduced. An obtained grain size is influenced by the pressure, vaporizing speed, and distance from the vaporizing source to the surface onto which the material must be deposited. When these factors are set to appropriate values, the grain size can be reduced. However, there is a limit in the method described above, so that the grain size can not be reduced further.

It is a secondary object of the present invention to provide a generation and collection method by which ultra fine particles of smaller grain size can be obtained through the gaseous vaporization method.

SUMMARY OF THE INVENTION

The aforementioned first object of the present invention can be accomplished by a gaseous vaporization method in which ultra fine particles vaporized from a vaporizing source are deposited onto the surface of a body and the deposited ultra fine particles are removed so that they can be recovered, and which is characterized in that: a wall (hereinafter referred to as a scatter-preventing-wall) is provided around a path of vaporized ultra fine particles between the vaporizing source and the surface of a body (hereinafter referred to as a deposit holding body) onto which the ultra fine particles are deposited; and an inert gas supply pipe is connected with the inside of the aforementioned wall. In this case, it is desirable that: the temperature of at least the inside of the aforementioned wall is higher than the thermal precipitation temperature of the ultra fine particles; and the temperature of the surface of a body onto which the ultra fine particles are deposited, is lower than the temperature of the vaporizing source and that of the wall, and further the temperature is low enough to cause thermal precipitation. More preferably, the temperature of the surface of a body onto which the ultra fine particles are deposited is as low as possible. For example, the surface of a body onto which the ultra fine particles are deposited is preferably cooled to the temperature of liquid nitrogen.

The object of the present invention can be accomplished by an apparatus in which ultra fine particles vaporized from the vaporizing source are deposited onto the surface of a continuously moving body and the deposited ultra fine particles are removed from the body, and which is characterized in that: a scatter-preventing-wall is provided around the path of scattered ultra fine particles between the aforementioned vaporizing source and the deposit holding body; the distance between the edge of the scatter-preventing-wall and the deposit holding body is not more than ½ of the distance between the deposit holding body and the vaporizable material; and the innert gas supply pipe is connected with the inside of the scatter-preventing-wall.

When a scatter-preventing-wall is provided around the path of ultra fine particles between the vaporizing source and the deposit holding body in accordance with the present invention, scatter of ultra fine particles in the direction of members except the deposit holding body can be prevented. Consequently, thermal precipitation of ultra fine particles to the inner wall of the vacuum chamber and other members can be prevented, so that the vaporized ultra fine particles are deposited only onto the surface of the deposit holding body. As a result, the collection ratio (the amount of recovered ultra fine particles/the amount of raw material which has been charged) is increased. For example, as shown in an embodiment which will be explained later, the collection ratio in a conventional case used to be 20–50%. On the other hand, the collection ratio in the case of the present invention is increased to 95%.

In the apparatus of the present invention, the path of inert gas is connected with the inside of the scatter-preventing-wall, so that ultra fine particles are carried by the flow of inert gas which has been guided inside the wall. Consequently, the ratio of deposition onto the surface of the deposit holding body is further increased.

In the manner described above, the amount of ultra fine particles deposited onto the inner wall of the vacuum chamber is remarkably reduced, so that it is not necessary to clean the inner wall at every batch, or even when the inner wall must be cleaned, cleaning can be performed very easily, so that productivity can be improved.

The aforementioned second object of the present invention can be accomplished by the following method. That is a gaseous vaporization method characterized in that: a vaporizing source containing vaporizable material is housed in a vacuum vessel; the aforementioned vaporizable material is vaporized or sublimated by heating the vaporizing source; and the vaporized material is cooled just after vaporized or sublimated by the inert gas introduced in the vessel so that ultra fine particles are formed, wherein the inert gas for cooling use collides with the flow of molecules of the aforementioned vaporizable material.

The Knudsen-cell type of vaporizing source may be used and inert gas may be directly supplied into the cells of the Knudsen-cell type of vaporizing source.

It is preferable that a Knudsen-cell type of vaporizing source, the horizontal section of which is circular, is used and inert gas is supplied into the cell of the vaporizing source from the side wall by an acute angle.

In the conventional method, there are caused the following problems. In a low vacuum such as $10^{-2}$ to $10^2$ Torr, molecules of the vapor which has been vaporized from the source, tend to flow upward due to an upward stream. On the other hand, inert gas supplied through a gas port formed in the bottom of the vacuum vessel goes upward in such a manner that the flow of inert gas surrounds the flow of the aforementioned vapor molecules. Accordingly, the inert gas does not collide with the vapor molecules sufficiently, so that the inert gas can not be effectively cooled. As a result, the grain size of the obtained ultra fine particles is limited.

According to the knowledge of the inventors, when inert gas for cooling use collides with the flow of molecules right after vaporization or sublimation so that the inert gas and the flow of molecules can be mixed, ultra fine particles of smaller grain size can be obtained.

Therefore, in the apparatus of the present invention, inert gas for cooling use collides and mixes with the vapor molecules right after the vaporizing material has been vaporized or sublimated. Consequently, ultra fine particles of smaller grain size can be obtained.

Figure 11:
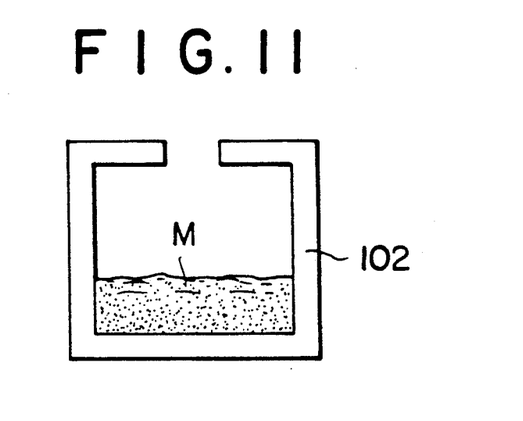
FIG. 11 is a view showing a Knudsen-cell vaporizing source.

When a Knudsen-cell type of vaporizing source, the upper opening of which is made small as shown in FIG. 11, which is frequently used in a process of vapor-deposition, is utilized, and when inert gas for cooling use is directly supplied into the cell of the Knudsen type of vaporizing source, the inside of the cell is filled with the inert gas which is circulated, so that the vapor molecules can be effectively cooled.

When a Knudsen-cell type of vaporizing source, the horizontal section of which is circular, is used and inert gas is supplied into the cell of the vaporizing source from the side wall by an acute angle (which is an angle formed by a tangent at the position where gas is blown in and the direction of the flow of gas which has been blown in), a vortex flow can be generated in the cell, so that inert gas can effectively collide and mix with vapor molecules. Not only inert gas such as argon or helium, but also non-reaction gas such as nitrogen gas in which a nitride is not formed, also can be utilized in the same manner described above.

BRIEF DESCRIPTION OF THE DRAWINGS

FIGS. 7-a, 7-b, 8, 9-a and 9-b are schematic illustrations showing conventional technology;

DETAILED DESCRIPTION OF THE PREFERRED EMBODIMENTS

Figure 1:
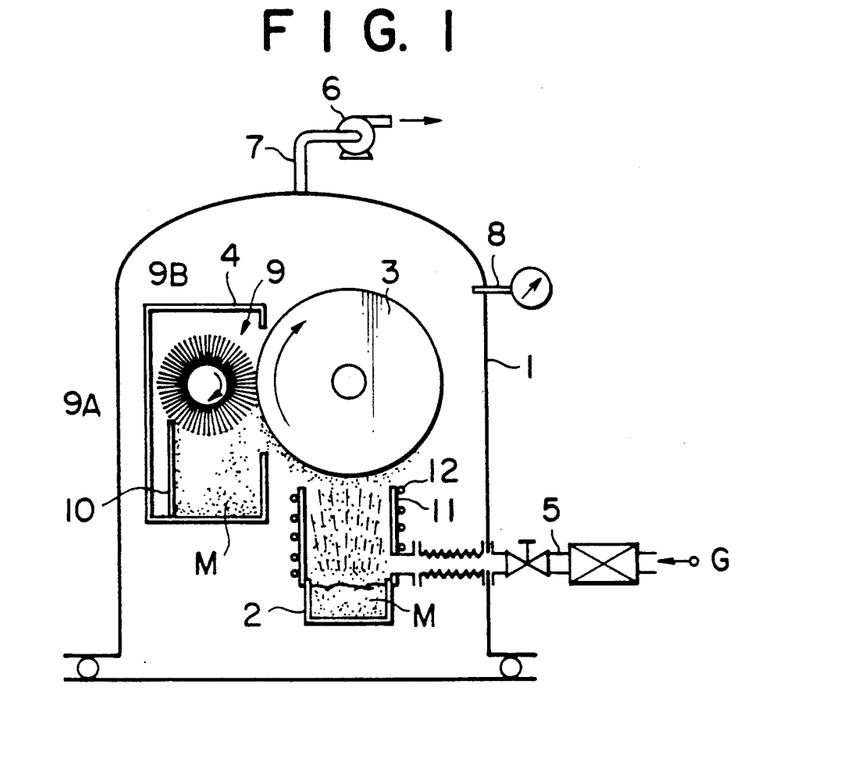
FIG. 1 is a schematic illustration of an embodiment of the present invention.
Figure 2:
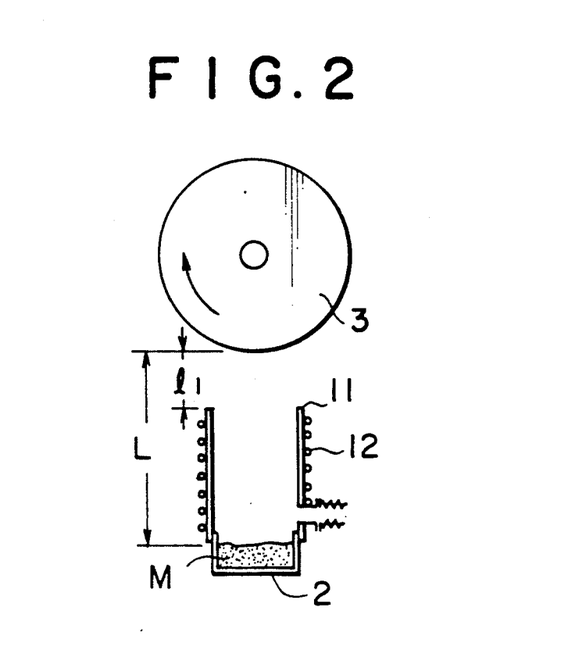
FIG. 2 is an enlarged view of a main portion of a variation of the embodiment.

FIG. 1 and FIG. 2 are schematic illustrations showing the first embodiment of the present invention. In a vacuum chamber 1, there are provided a vessel 2 for vaporizable material M, a rotating drum 3, the outer surface of which is cylindrical, and a collection box 4, a portion of which is opened so that the opening can face the aforementioned rotating drum 3. The vacuum chamber 1 is connected with a supply pipe 5, through which inert gas G such as argon or helium is charged, and connected with an exhaust pipe 7 which is connected with a vacuum pump 6. A pressure gauge 8 to detect the degree of vacuum is installed on the vacuum chamber 1. The rotating drum 3 is disposed above the vessel 2. The collection box 4 is formed by heat insulating material so that it is insulated from the vessel 2 and the surface of the rotating drum 3 onto which vaporizable material M is adhered.

In the collection box 4, a cylindrical brush 9 having a large number of brush bristles 9B is provided around a brush roller 9A in such a manner that: the cylindrical brush 9 comes into contact with the surface of the rotating drum 3 through an opening formed on the collection box 4; and the rotating axis of the cylindrical brush 9 is in parallel with the rotating axis of the rotating drum 3. In this embodiment, the rotating drum 3 is rotated clockwise by a motor not illustrated in the drawing, and the brush roller 9A is also rotated clockwise by a motor not illustrated in the drawing so that the cylindrical brush 9 can be rotated. In this case, the rotating drum 3 comes into contact with the cylindrical brush 9 in such a manner that the circumferential surface of the rotating drum 3 moves in the opposite direction to the circumferential surface of the cylindrical brush 9. It is possible to rotate the cylindrical brush in the reverse direction.

A scraper 10 is installed in the collection box 4 in such a manner that the tip of the scraper 10 contacts with the bristles 9B of the cylindrical brush 9 when the cylindrical brush 9 is rotated.

The vessel 2 for vaporizable material M is preferably made of ceramic. The vessel 2 is heated to the temperature at which material M is sufficiently vaporized, by means of heater heating, induction heating, laser heating, resistance heating, or electron gun heating. At this time, the temperature of the rotating drum 3 is maintained at the temperature of the inside of the vacuum chamber 1, or the rotating drum is preferably cooled, for example, the rotating drum 3 is cooled to 10° C. When a cooling medium such as cooled water flows inside the rotating drum 3, the rotating drum 3 can be cooled to the aforementioned temperature. It is preferable to cool the rotating drum 3 by liquid nitrogen.

In the apparatus of the present invention, a scatter-preventing-wall 11, which prevents ultra fine particles from scattering in the direction other than the direction of the rotating drum 3 onto which the ultra fine particles are deposited, is provided in such a manner that the scatter-preventing-wall 11 extends from the vessel 2 to the rotating drum 3. As shown in FIG. 1, the upper end of the scatter-prevention-wall 11 is located close to the rotating drum 3. The scatter-prevention-wall 11 is provided with a heater 12 so that the wall 11 can be heated.

The blow tube 5 for inert gas G is connected with the portion of the vacuum chamber 1 which is shielded by the scatter-preventing-wall 11. The behavior of inert gas G blown into the vacuum chamber 1 will be described as follows. While inert gas G repeatedly collides with the vapor molecules of material M so that ultra fine particles are formed, inert gas G is sucked by a vacuum pump 6 together with ultra fine particles which are vaporized, and reaches a position close to the rotating drum 3. After that, inert gas G flows from a gap between the upper end of the scatter-preventing-wall 11 and the rotating drum 3 into the inside of the vacuum chamber 1, then inert gas G is exhausted outside.

In the apparatus composed in the manner described above, the pressure inside the vacuum chamber 1 is lowered by the vacuum pump 6 so that a high vacuum state can be achieved, then inert gas is charged inside the scatter-preventing-wall 11 and pressure inside the vacuum chamber is preferably maintained at 0.01 to 50 Torr. When vaporizable material M is heated under the aforementioned condition, vaporized material M continuously adheres onto the surface of the rotating drum 3. Since inert gas is blown inside the scatter-preventing-wall 11 in this embodiment, vaporized material M is cooled by the inert gas right after it has been vaporized, and at the same time, vaporized material M is carried together with the inert gas, so that the directivity of vaporized material M to the surface of the rotating drum 3 is increased.

Material M which has been deposited onto the surface of the rotating drum 3, is scraped off by the brush 9, the surface of which is moved in the opposite direction to the surface of the rotating drum 3. The scraped material is recovered into the collection box 4. Material M which has adhered onto the brush bristles 9b is scraped off by the scraper 10 which comes into contact with the brush bristles. After material M has been scraped off from the surface of the rotating drum 3, new material adheres onto the surface. In the aforementioned manner, material M is continuously adhered onto and scraped off from the surface of the rotating drum 3.

The material adhered onto the surface of the rotating drum 3 is quickly scraped off from the surface without receiving radiation heat from the heat source for heating material, so that heat damage which tends to occur in the conventional apparatus, can be avoided, and ultra fine particles of high quality can be obtained. The interval from deposition to scraping can be set to an optional value by adjusting the revolution speed of the rotating drum 3.

When the amount of recovered ultra fine particles has become a predetermined value, the gaseous vaporizing operation is stopped and the recovered material is removed from the vacuum chamber 1.

Figure 3:
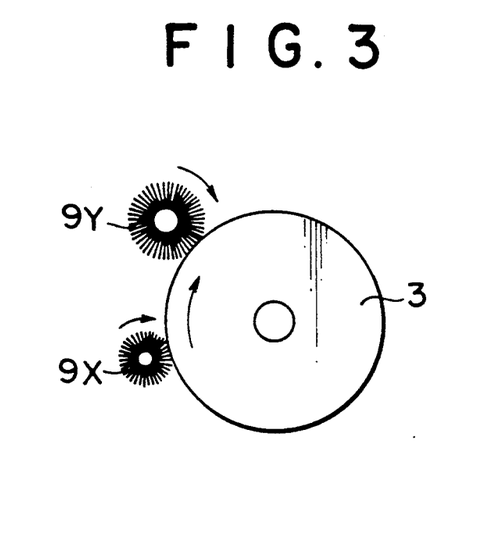
FIGS. 3, 4 and 5 are schematic illustrations of variations.

FIG. 3 shows a variation in which two cylindrical brushes 9X, 9Y are provided with regard to one rotating drum 3. In this case, scraping force of the cylindrical brush 9Y can be made larger than that of the cylindrical brush 9X.

Quality, flock density, height, and size of the brush bristles 9B can be appropriately selected. Metallic fiber is usually used for the brush bristles. However, carbon fiber can be also used. Appropriate material can be used for the rotating drum 3. Metal is usually used for the rotating drum 3.

Figure 4:
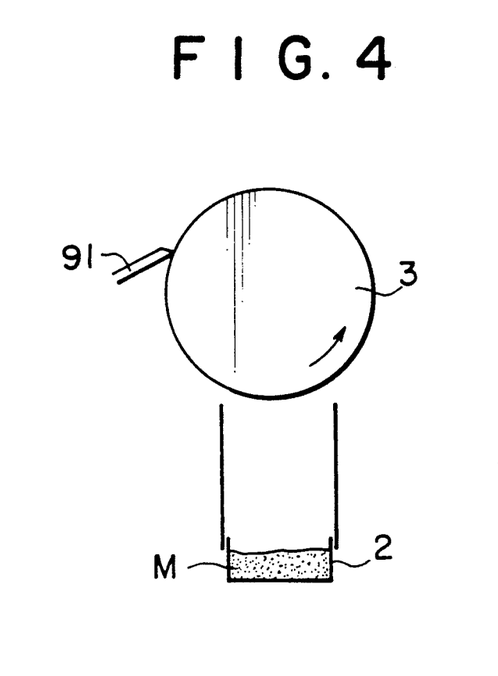
Figure 5:
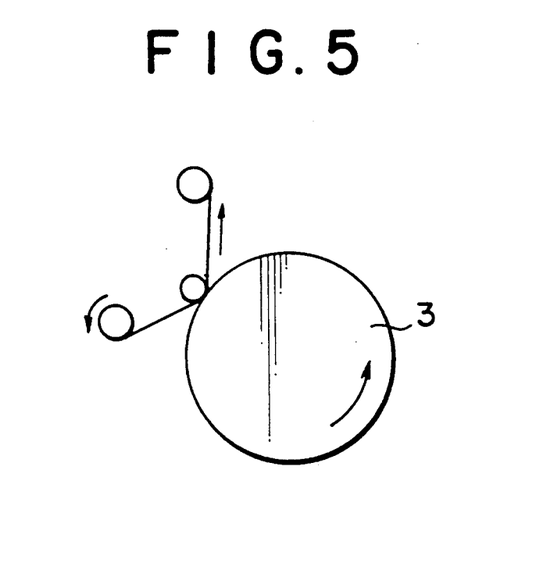

As a means to scrape off ultra fine particles from the surface of the rotating drum 3, not only the aforementioned brush system, but also a scraping blade 91 system illustrated in FIG. 4 or a wiping web 92 system illustrated in FIG. 5 can be adopted. In the aforementioned web 92 system, the ultra fine particles adhered onto the web 92 are recovered from the web 92 after the web 92 has been wound.

Concerning a deposit holding body, it is preferable to utilize the aforementioned rotating drum onto which ultra fine particles are continuously deposited while the drum is being rotated, and continuously scraped off, from the viewpoint of reducing thermal deterioration of ultra fine particles. However, it is also possible to use the conventional deposit holding body shown in FIGS. 7-a and 7-b.

In the apparatus of the present invention, the upper end of the scatter-preventing-wall 11 is not necessarily located close to the surface of the rotating drum 3 which is the deposit holding body in this embodiment. The reason is as follows. When distance 11 between the upper end of the scatter-preventing-wall 11 and the lower end of the rotating drum 3 is not more than ½ of distance L between the rotating drum 3 and material M, the direction of vaporized ultra fine particles are influenced by the scatter-preventing-wall 11, so that the amount of ultra fine particles which scatter in the direction deviated from the rotating drum 3 can be remarkably reduced. However, it is preferable that distance 11 is not more than 20 mm.

In order to prevent thermal precipitation of ultra fine particles, the temperature of the inner surface of the scatter-preventing-wall 11 is preferably maintained at a temperature higher than the thermal precipitation temperature of the ultra fine particles by the heater 12. Thermal precipitation is defined as a phenomenon in which vaporized ultra fine particles are deposited (precipitated) on a wall due to a temperature gradient in the position close to the wall according to the phenomenon of thermal migration.

The temperature of a deposit holding body is maintained at a temperature not higher than the vaporizing temperature of vaporizable material and the temperature of a scatter-preventing-wall, and is as low as possible in a predetermined range so that the temperature gradient between the vaporizing source and the deposit holding body can be made large.

The aforementioned temperature setting must be determined according to the kind of objective material, so that the temperature is set appropriately according to the kind of material.

In the aforementioned embodiments, vaporizable material is supplied into the vacuum chamber batch by batch. However, it is possible to supply the material into the chamber continuously by a screw feeder or other conveying means like that, which can improve productivity.

The present invention can be preferably applied to the production of ultra fine particles, the grain size of which is 10 to tens of thousands Å, and more particularly the production of super ultra fine particles, the grain size of which is 10 to thousands Å. The kind of the ultra fine particles may be inorganic material, metallic material, or organic material. The inventors have confirmed that the present invention is the most appropriate when an organic pigment is obtained, and more particularly the most appropriate when an anthanthrone pigment is obtained in the case where an organic photoreceptor is produced.

5 An organic photoreceptor can be generally obtained by providing organic photo-conductive particles on an electrically conductive base in such a manner that the organic photo-conductive particles are dispersed in a binder resin by the action of dispersing groups.

In this case, two types of photoreceptors can be obtained, one is a mono-layer type of photoreceptor and the other is a separating function type of photoreceptor. In the mono-layer type of photoreceptor, organic photo-conductive particles (a pigment) are provided as an electrical charge generating material on an electrically conductive base in such a manner that the photoconductive particles are dispersed in an electrical charge conveyance material, and in the separating function type of photoreceptor, an electrical charge generating material layer is formed on an electrical conductive base and an electrical charge conveyance material layer is formed thereon. The method and apparatus of the present invention are suitable for obtaining ultra fine particles which are used in the production of photoreceptors described above.

An embodiment of the present invention will be described.

INVENTIVE EXAMPLE

A gaseous vaporization was conducted in the apparatus shown in FIG. 1.

Organic pigment ultra fine particles utilized to produce an organic photoreceptor for electrophotography, were generated and recovered by the apparatus illustrated in FIG. 1. In this case, the producing operation was conducted as follows: 4, 10-dibromoanthanthrone was used for the organic pigment, the vacuum chamber was filled with helium gas, the pressure inside the chamber was reduced to $10^{-1}$ Torr, and the material was heated to 300°–350° C. and vaporized in vacuum so that ultra fine particles could be obtained. Distance L from material M to the surface of the rotating drum 3 was set to 95 mm, and the distance 11 from the scatter-preventing-wall 11 to the surface of the rotating drum 3 was set to 10 mm.

As a result, ultra fine particles which were not thermally deteriorated could be obtained at a collection rate of about 95%.

Five operations were consecutively conducted in which new material was supplied into the vessel after the remains had been removed without cleaning the inside of the vacuum chamber. There was no difference between the recovered particles.

COMPARATIVE EXAMPLE 1

Operating conditions were the same as the inventive example except that a scatter-preventing-wall was not provided in the apparatus of the comparative example 1. The collection ratio of ultra fine particles was examined, which was about 45%. After one operation had been conducted, the inside of the vacuum chamber was inspected. As a result, it was found out that a large amount of fine particle had adhered on the inner wall of the vacuum chamber It was necessary to clean the inner wall in order to remove the adhered ultra fine particles so as to start the next operation.

COMPARATIVE EXAMPLE 2

Figure 6:
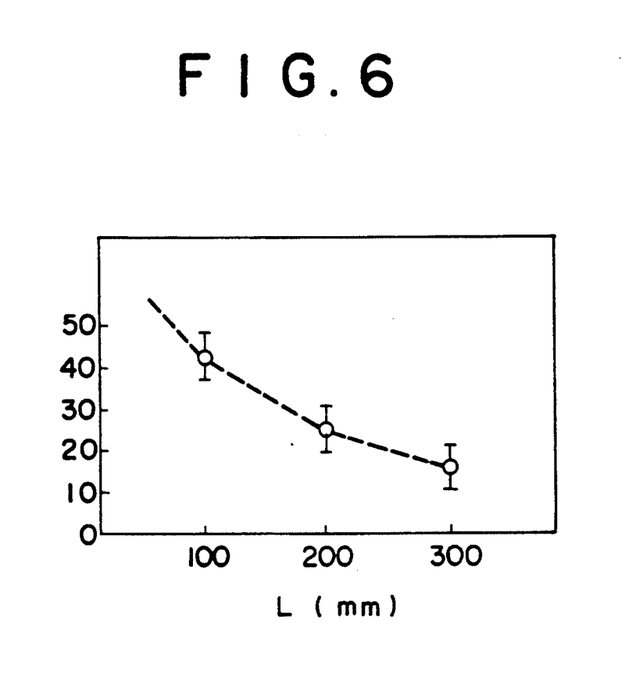
FIG. 6 is a graph showing the collection ratio.

Under the same conditions as the Comparative Example 1, distance L between material M and the surface of the rotating drum 3 was varied. As a result, it became clear that the collection ratio largely depended on distance L, which is shown in FIG. 6.

When distance L was extremely short, the collection ratio was increased. However, when distance L was set to 30 mm, the shape of recovered ultra fine particles became like thread, and the color inside the ultra fine particle was orange and the color of the surface was scarlet. Consequently, it became clear that the ultra fine particles were thermally deteriorated.

According to the present invention, the collection ratio can be increased, and the frequency of cleaning the inner wall of the vacuum chamber can be lowered, so that productivity can be improved.

The present invention will be further explained in detail as follows.

Figure 10:
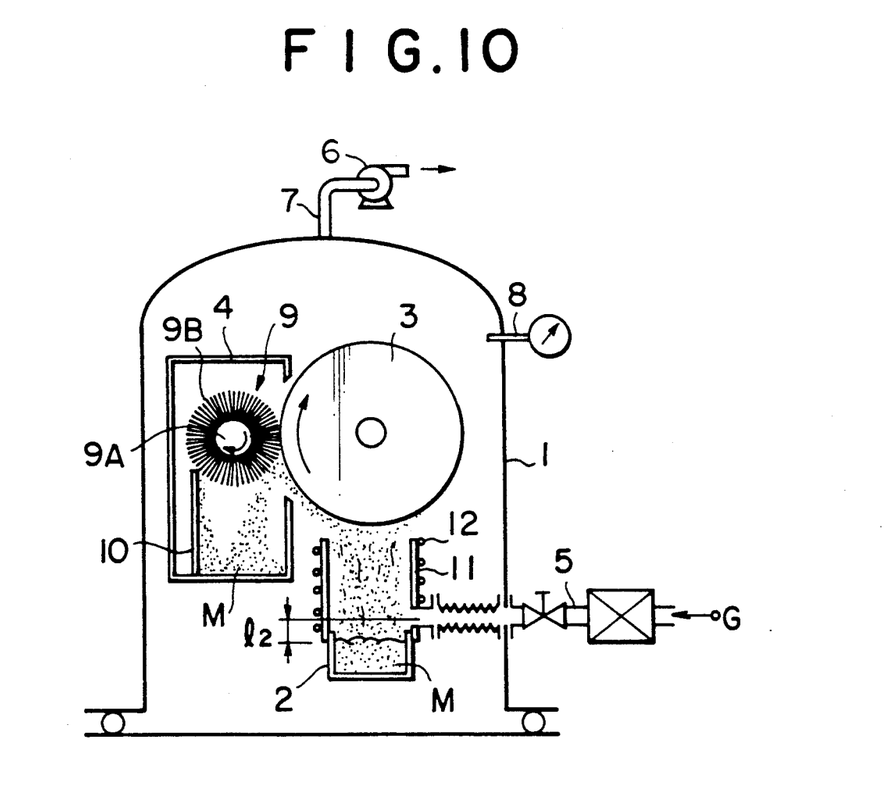
FIG. 10 is a schematic illustration of another embodiment relating to the generation method of ultra fine particles of the present invention.

FIG. 10 is a schematic illustration showing another embodiment relating to the ultra fine particle generating and recovering method of the present invention. In a vacuum chamber 1, there are provided a vessel 2 for vaporizable material M, a cylindrical rotating drum 3, and a collection box 4, a portion of which is opened so that the opening can face the aforementioned rotating drum 3. With a vacuum chamber 1 are connected a supply pipe 5 for non-active gas G such as inert gas of argon or helium, or $N_2$, and an exhaust pipe 7 which is connected with a vacuum pump 6. A pressure gauge 8 to detect the degree of vacuum is installed on the vacuum chamber 1. The rotating drum 3 is disposed above the vessel 2. The collection box 4 is formed of heat insulating material so that it is insulated from the vessel 2 and the surface of the rotating drum 3 onto which vaporizable material M is adhered.

In the collection box 4, a cylindrical brush 9 having a large number of brush bristles 9B is provided around a brush roller 9A in such a manner that: the cylindrical brush 9 comes into contact with the surface of the rotating drum 3 through an opening formed on the collection box 4; and the rotating axis of the cylindrical brush 9 is in parallel with the rotating axis of the rotating drum 3. In this embodiment, the rotating drum 3 is rotated clockwise by a motor not illustrated in the drawing, and the brush roller 9A is also rotated clockwise by a motor not illustrated in the drawing so that the cylindrical brush 9 can be rotated. In this case, the rotating drum 3 comes into contact with the cylindrical brush 9 in such a manner that the circumferential surface of the rotating drum 3 moves in the opposite direction to the circumferential surface of the cylindrical brush 9. It is possible to rotate the cylindrical brush in the reverse direction.

A scraper 10 is installed in the collection box 4 in such a manner that the tip of the scraper 10 contacts with the bristles 9B of the cylindrical brush 9 when the cylindrical brush 9 is rotated.

Quality, flock density, height, and size of the brush bristles 9B can be appropriately selected. Metallic fiber is usually used for the brush bristles. However, carbon fiber can be also used. Appropriate material can be used for the rotating drum 3. Metal is usually used for the rotating drum 3.

The vessel 2 for vaporizable material M is preferably made of ceramic. The vessel 2 or/and vaporizable material M are heated to the temperature at which material M is sufficiently vaporized, by means of heater heating, induction heating, laser heating, resistance heating, or electron gun heating. At this time, the temperature of the rotating drum 3 is maintained at the temperature lower than that of the vessel 2 and the scatter-preventing-wall 11, or the rotating drum is preferably cooled, for example, the rotating drum 3 is cooled to 10° C. When a cooling medium such as cooled water flows inside the rotating drum 3, the rotating drum 3 can be cooled to the aforementioned temperature. It is preferable to cool the rotating drum 3 by liquid nitrogen.

In the apparatus of the present invention, a scatter-preventing-wall 11, which prevents ultra fine particles from scattering in the direction other than the direction of the rotating drum 3 onto which the ultra fine particles are deposited, may be provided in such a manner that the scatter-preventing-wall 11 extends from the vessel 2 to the rotating drum 3. The upper end of the scatter-prevention-wall 11 is preferably located close to the rotating drum 3. The scatter-prevention-wall 11 is provided with a heater 12 so that the wall 11 can be heated.

The blow tube 5 for inert gas G is connected with the portion of the vacuum chamber 1 which is shielded by the scatter-preventing-wall 11. The behavior of inert gas G blown into the vacuum chamber 1 will be described as follows While inert gas G repeatedly collides with the vapor molecules of material M so that ultra fine particles are formed, inert gas G is sucked by a vacuum pump 6 together with ultra fine particles which are vaporized, and reaches a position close to the rotating drum 3. After that, inert gas G flows from a gap between the upper end of the scatter-preventing-wall 11 and the rotating drum 3 into the inside of the vacuum chamber 1, then inert gas G is exhausted outside. The aforementioned blow tube 5 is disposed in such a manner that distance 12 between the center line of the blow tube 5 and the top of vaporizable material is preferably not more than 20 cm, and more preferably not more than 10 cm.

Figure 12:
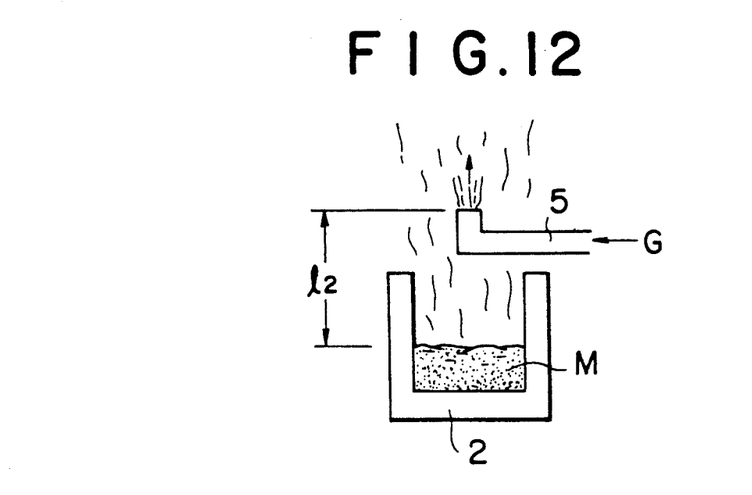
FIG. 12 is a view showing a variation of inert gas supplying means.

Further, the aforementioned blow tube 5 may be provided in such a manner that: the blow tube 5 is extended so that one end of the blow tube 5 is located above the center of the vessel 2; and inert gas G is blown upward from the end of the blow tube. In the aforementioned case, vaporized molecules can collide and mix with inert gas G while they flow along the flow of inert gas.

Figure 13:
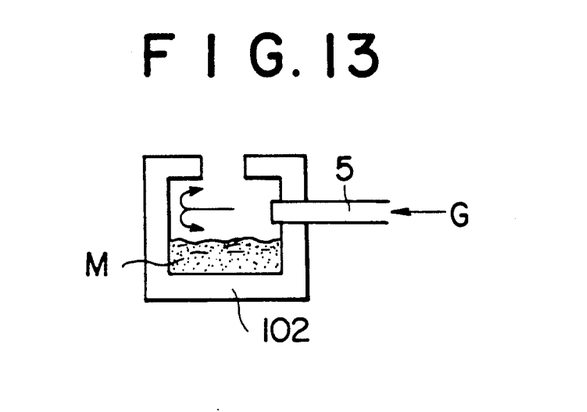
FIG. 13 is a view showing the supply of inert gas in the case of a Knudsen-cell vaporizing source.

A Knudsen-cell type of vessel 102 may be used for the vessel 2 and the blow tube 5 may be connected with the inside of the vessel 102. In the aforementioned case, the vessel is filled with inert gas G which has been supplied into the cell, and inert gas G is circulated in the vessel, so that inert gas G effectively collides and mixes with vaporized molecules.

Figure 14:
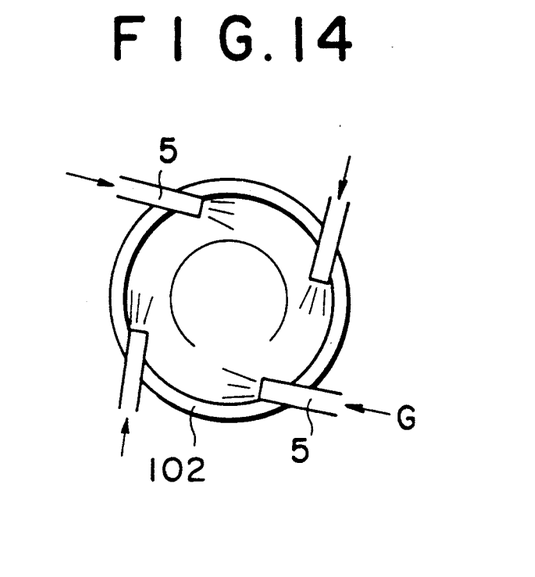
FIG. 14 is a view showing a variation of inert gas supply method.

When a Knudsen type of vessel 102, the lateral section of which is circular, is used as illustrated in FIG. 14 and at least one blow tube 5 is connected with the vessel 102 in such a manner that the blow tube and the side wall of the vessel can form an acute angle in order to supply inert gas, a vortex flow can be caused inside the cell. Accordingly, vaporized molecules and inert gas can more effectively collide and mix with each other.

Figure 15:
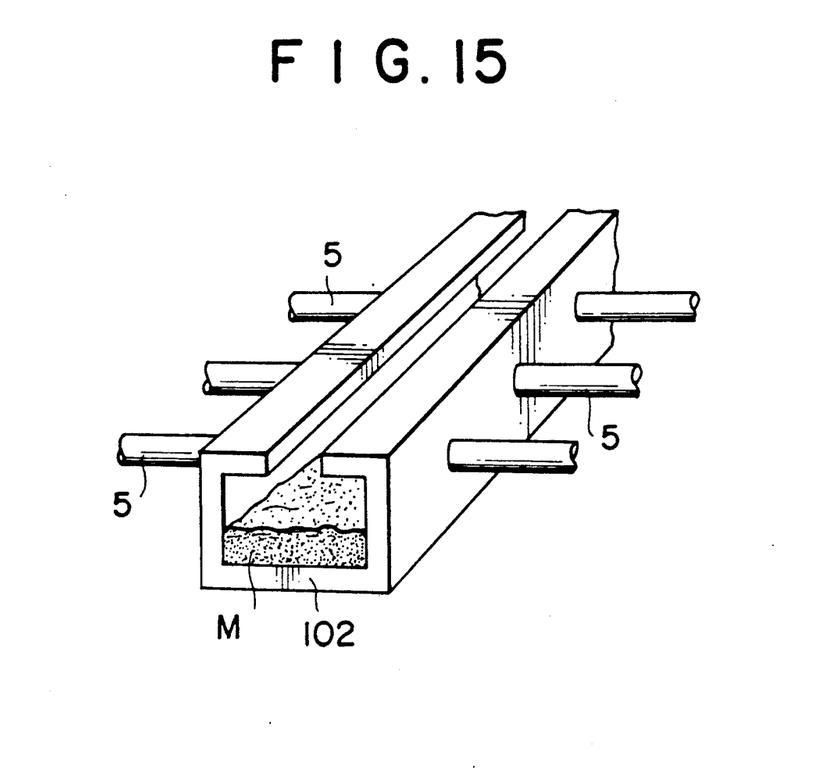
FIG. 15 is a schematic view showing an example of a long vaporizing source.

When a vessel 102 is long, a plurality of blow tubes 5, 5, are provided as illustrated in FIG. 15 so as to blow inert gas into the vessel. Then, the vessel is filled with inert gas and vaporized molecules can be effectively cooled.

Figure 16:
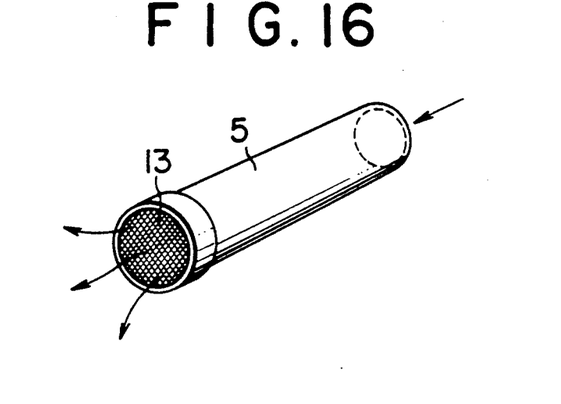
FIG. 16 and FIG. 17 are schematic illustrations showing the end portion treatment of a blow tube.
Figure 17:
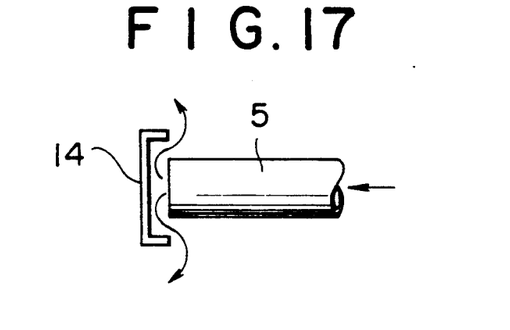

Inert gas may be directly blown into the vessel from the open end of the aforementioned blow tube 5. In the case where vaporizable material M is disturbed by the inert gas flow, the open end may be covered with a mesh cover 13 as illustrated in FIG. 16. Further, as illustrated in FIG. 17, a baffle plate 14 may be disposed in a position opposed to the tip of the blow tube 5, wherein a narrow gap is made between the baffle plate and the tip of the blow tube.

In the apparatus described above, after pressure inside the vacuum chamber 1 has been reduced by a vacuum pump 6 to a high vacuum of $10^{-3}$–$10^{-6}$ Torr, inert gas is supplied inside the scatter-preventing wall 11. When vaporizable material M is heated under the aforementioned conditions, a gaseous vaporization occurs, and vaporized material M continuously adheres onto the surface of a rotating drum 3. In the embodiments explained above, inert gas is blown to a position close to vaporizable material M from the blow tube 5, so that vaporizable material M is cooled by inert gas right after it has vaporized, and adheres onto the surface of the rotating drum 3 being raised along with the inert gas.

Material M adhered onto the rotating drum 3 surface is scraped off at the contact position by the brush 9 and recovered into the collection box 4. Material M adhered onto the bristles 9B is scraped off in the same way since the scraper 10 comes into contact with the tips of the bristles 9B. The next new material is adhered onto the rotating drum 3 surface from which material M has been scraped off. In the way mentioned above, adhesion and scraping of material M are continuously conducted on the surface of the rotating drum 3.

The material adhered onto the surface of the rotating drum 3 is quickly scraped off from the surface without receiving radiation heat from the heat source for heating material, so that heat damage can be avoided, and ultra fine particles of high quality can be obtained. The interval from deposition to scraping can be set to an optional value by adjusting the revolution speed of the rotating drum 3.

When the amount of recovered ultra fine particles has become a predetermined value, the gaseous vaporizing operation is stopped and the recovered material is removed from the vacuum chamber 1.

In order to remove and collect ultra fine particles adhered onto the surface of the rotating drum 3, not only the aforementioned brush system but also other systems such as a scraping blade system or a wiping cloth system can be adopted.

Concerning a deposit holding body, it is preferable from the viewpoint of reducing thermal deterioration to use a rotating drum explained in the aforementioned example, onto which ultra fine particles are continuously adhered while the drum is being rotated, and from which the adhered ultra fine particles are continuously removed.

In order to prevent thermal precipitation of ultra fine particles, the temperature of the inner surface of the scatter-preventing-wall 11 is preferably maintained at a temperature higher than the thermal precipitation temperature of the ultra fine particles by the heater 12. Thermal precipitation is defined as a phenomenon in which vaporized ultra fine particles are deposited (precipitated) on a wall due to a temperature gradient in the position close to the wall according to the phenomenon of thermal migration.

The temperature of a deposit holding body is maintained at a temperature not higher than the vaporizing temperature of vaporizable material and the temperature of a scatter-preventing-wall, and is as low as possible in a predetermined range so that the temperature gradient between the vaporizing source and the deposit holding body can be made large.

The aforementioned temperature setting must be determined according to the kind of objective material, so that the temperature is set appropriately according to the kind of material.

The present invention can be preferably applied to the production of ultra fine particles, the grain size of which is 10 to tens of thousands Å, and more particularly the production of super ultra fine particles, the grain size of which is 10 to thousands Å. The kind of the ultra fine particles may be inorganic material, metallic material, or organic material. The inventors has confirmed that the present invention is the most appropriate when an organic pigment is obtained, and more particularly the most appropriate when an anthanthrone pigment is obtained in the case where an organic photoreceptor is produced.

An organic photoreceptor can be generally obtained by providing organic photo-conductive particles on an electrically conductive base in such a manner that the organic photo-conductive particles are dispersed in a binder resin by the action of dispersing groups.

In this case, two types of photoreceptors can be obtained, one is a mono-layer type of photoreceptor and the other is a separating function type of photoreceptor. In the mono-layer type of photoreceptor, organic photo-conductive particles (a pigment) are provided as an electrical charge generating material on an electrically conductive base in such a manner that the photoconductive particles are dispersed in an electrical charge conveyance material, and in the separating function type of photoreceptor, an electrical charge generating material layer is formed on an electrical conductive base and an electrical charge conveyance material layer is formed thereon. The method and apparatus of the present invention are suitable for obtaining ultra fine particles which are used in the production of photoreceptors described above.

An embodiment of the present invention will be described referring to an embodiment.

Next, the effect of the present invention will be made clear through an embodiment.

Organic pigment ultra fine particles utilized to produce an organic photoreceptor for electrophotography, were generated and recovered. In this case, the producing conditions were as follows: 4, 10-dibromoanthanthrone was used for the organic pigment; the vacuum chamber was filled with helium gas; the pressure inside the chamber was reduced to $10^{-1}$ Torr; and the material was heated to 300°–350° C. and vaporized in vacuum so that ultra fine particles could be obtained. Ultra fine particles were obtained in three cases: Case 1 to which the conventional method shown in FIG. 8 was applied; Case 2 which was an embodiment of the present invention shown in FIG. 10; and Case 3 in which a Knudsen-cell type of vaporizing source was utilized. In Case 2, distance 12 between the blow tube 5 and the top of vaporizing material was set to 20 cm.

The results of the aforementioned experiment are shown in Table 1.

TABLE 1

| Case | Averaged grain size $D_{50}$ of ultra fine particles |
|---|---|
| Case 1 | 0.3–1.0 μm |
| Case 2 | 0.2–0.4 μm |
| Case 3 | 0.05–0.2 μm |

It is made clear by Table 1 that: in Case 2 which is an embodiment of the present invention, the averaged particle size of the obtained ultra fine particles is small compared with Case 1 which is a conventional case; and in Case 3 in which a Knudsen-cell type of vaporizing source is utilized, smaller size ultra fine particles can be obtained compared with Case 2.

Figure 18:
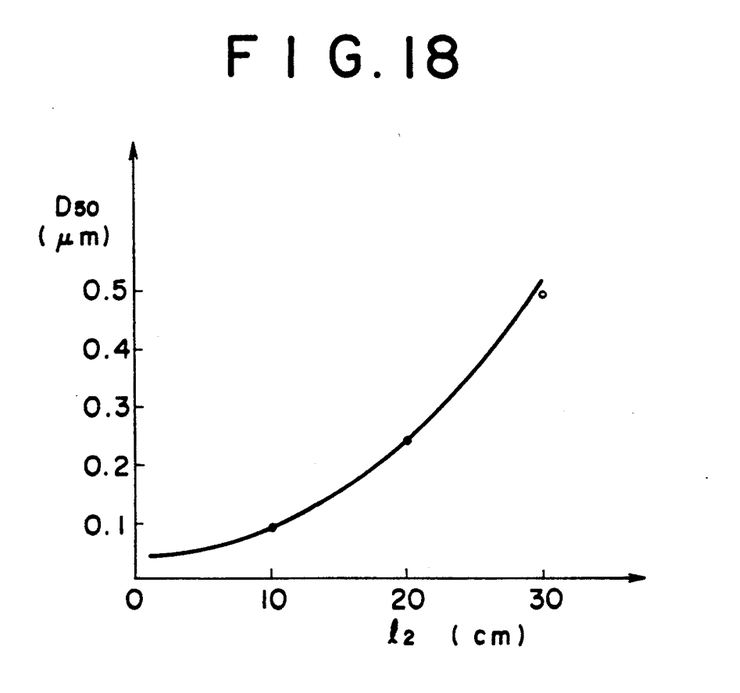
FIG. 18 is a graph showing the experimental results of an embodiment of the present invention.

In Case 2, an experiment was conducted in order to find out the correlation between distance 12 from the position of the blow tube to the top of vaporizable material and the averaged grain size $D_{50}$ of obtained ultra fine particles, the result of which is shown in the graph illustrated in FIG. 18. According to the graph shown in FIG. 18, it can be understood that: the smaller the distance 12 is, the smaller the averaged size of ultra fine particles is; and when vaporized molecules directly collide and mix with inert gas, the molecules can be effectively cooled. A specific relation exists between distance 42 and averaged ultra fine particle size $D_{50}$. Consequently, when this relation is previously found out, distance 12 can be determined in accordance with grain size $D_{50}$ of ultra fine particles.

As explained above, according to the present invention, ultra fine particles, the grain size of which is made smaller, can be obtained by the gaseous vaporization method, and when the ultra fine particles are applied to electrophotography, the photographic characteristics can be improved.

What is claimed is:

1. A method for producing ultra fine particles of a material, said method comprising;
    setting an evaporation vessel containing said material in a vacuum chamber;
    evaporating said material from said evaporation vessel into a confined space bounded by a scatter prevention wall and said evaporation vessel, said scatter prevention wall guiding a flow of said evaporated material through said confined space toward a deposit holding body;
    blowing an inert gas from a supply duct into said confined space whereby said inert gas directly collides with and cools said evaporated material to convert said evaporated material into ultra fine particles;
    depositing said ultra fine particles onto a surface of said deposit holding body; and
    collecting deposited ultra fine particles from said deposit holding body.

2. The method of claim 1, wherein an inner surface temperature of said scatter preventing wall is maintained higher than a thermal precipitation temperature of said ultra fine particles.

3. The method of claim 1, wherein a surface temperature of said deposit holding body is maintained lower than both an inner surface temperature of said scatter preventing wall and a temperature of said evaporation vessel, and said surface temperature of said deposit holding body is low enough for generating a thermal precipitation of said ultra fine particles on said surface of said deposit holding body.

4. A method of producing ultra fine particles of a material, said method comprising:
    setting an evaporation vessel containing said material in a vacuum chamber;
    evaporating said material in said evporation vessel;
    injecting an inert gas through an inert gas suply duct into said evaporation vessel, said inert gas cooling said evaporated material to form ultra fine particles;
    directing a flow of said ultra fine particles toward a deposit holding body through a confined space bounded by said evaporation vessel and a scatter prevention wall;
    depositing said ultra fine particles onto a surface of said deposit holding body; and
    collecting said ultra fine particles form said surface of said deposit holding body.

5. The method of claim 4, wherein the side wall of the evaporation vessel forms a cylindrical shape and the inert gas is blown into the evaporation vessel from an outlet of a duct opened on the inner surface of the side wall in a direction to form an acute angle with the inner surface of the side wall.

6. The method of claim 4 wherein said evaporation vessel is a Knudsen cell.

* * * * *